(12) United States Patent
Kuhara et al.

(10) Patent No.: US 7,684,848 B2
(45) Date of Patent: Mar. 23, 2010

(54) MAGNETIC RESONANCE IMAGING APPARATUS AND MAGNETIC RESONANCE IMAGING APPARATUS CONTROL METHOD

(75) Inventors: Shigehide Kuhara, Otawara (JP); Masao Yui, Otawara (JP); Yoshimori Kassai, Nasushiobara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 1025 days.

(21) Appl. No.: 11/231,878

(22) Filed: Sep. 22, 2005

(65) Prior Publication Data

US 2007/0066886 A1   Mar. 22, 2007

(51) Int. Cl.
*A61B 5/05* (2006.01)
(52) U.S. Cl. .................. 600/413; 600/407; 600/410; 324/307; 324/309
(58) Field of Classification Search ................ 600/407, 600/410–423, 408; 324/306–309, 318–322
See application file for complete search history.

(56) References Cited

U.S. PATENT DOCUMENTS

| | | | |
|---|---|---|---|
| 4,710,717 A | 12/1987 | Pelc et al. | |
| 5,377,680 A | 1/1995 | Bernstein et al. | |
| 5,997,883 A | 12/1999 | Epstein et al. | |
| 6,144,201 A | 11/2000 | Miyazaki | |
| 6,510,337 B1 | 1/2003 | Heuscher et al. | |
| 6,771,999 B2 | 8/2004 | Salla et al. | |
| 2002/0156366 A1 | 10/2002 | Stainsby et al. | |

FOREIGN PATENT DOCUMENTS

| | | | |
|---|---|---|---|
| JP | 6-245922 | | 9/1994 |
| WO | WO 2005/022185 | * | 3/2005 |
| WO | WO 2005/022185 A1 | | 3/2005 |

OTHER PUBLICATIONS

Biet al., "Contrast-Enhanced 4D Radial Coronary Artery Imaging at 3.0 T Within a Single Breath-Hold", Magnetic Resonance in Medicine, vol. 54, Jul. 19, 2005 (pp. 470-475).*

Lenz et al., "Retrospective Cardiac Gating: A Review of Technical Aspects and Future Directions", pp. 445-455, vol. No. 5, Sep. 1989, Magnetic Resonance Imaging.*

(Continued)

*Primary Examiner*—Brian Casler
*Assistant Examiner*—John F Ramirez
(74) *Attorney, Agent, or Firm*—Nixon & Vanderhye P.C.

(57) ABSTRACT

Data acquisition based on the same MRI encoding pattern is repeated at least once for each R wave occurring at time $T_0$ used as a trigger. The necessary number of data for image reconstruction are extracted as subsets of a complete MRI data set from the resulting plural sets of acquired MRI by temporally retrospecting from the next R wave occurrence time (time $T_1$) after the R wave (time $T_0$) used as the trigger. The extracted data subsets are then rearranged to generate a complete composite MRI data set which is then used for image reconstruction of heart movement associated with end-diastole after the occurrence of the triggering R wave.

14 Claims, 10 Drawing Sheets

OTHER PUBLICATIONS

Extended European Search Report dated Feb. 5, 2007.
Bi et al., "Contrast-Enhanced 4D Radial Coronary Artery Imaging at 3.0 T Within a Single Breath-Hold", Magnetic Resonance in Medicine, vol. 54, Jul. 19, 2005 (pp. 470-475).
Lenz et al., "Retrospective Cardiac Gating: A Review of Technical Aspects and Future Directions", pp. 445-455, vol. 7, No. 5, Sep. 1989, Magnetic Resonance Imaging.
Hofman et al, "Quantification of In-Plane Motion of the Coronary Arteries During the Cardiac Cycle: Implications for Acquisition Window Duration for MR Flow Quantification", Journal of Magnetic Resonance Imaging, vol. 8, 1998, pp. 568-576.
Weber Om et al., "Whole-Heart Steady-State Free Precession Coronary Artery Magnetic Resonance Angiography", Magnetic Resonance in Medicine, vol. 50, Nov. 21, 2003, pp. 1223-1228.

* cited by examiner

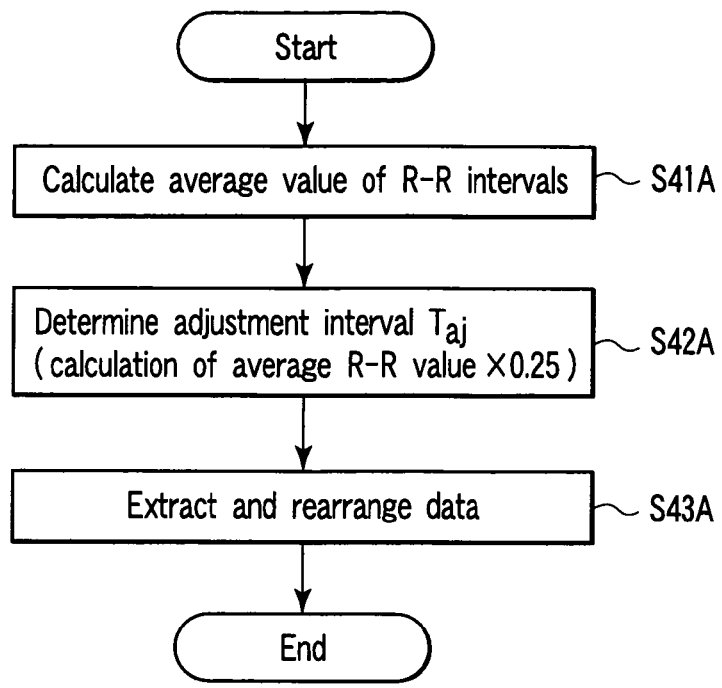
F I G. 8
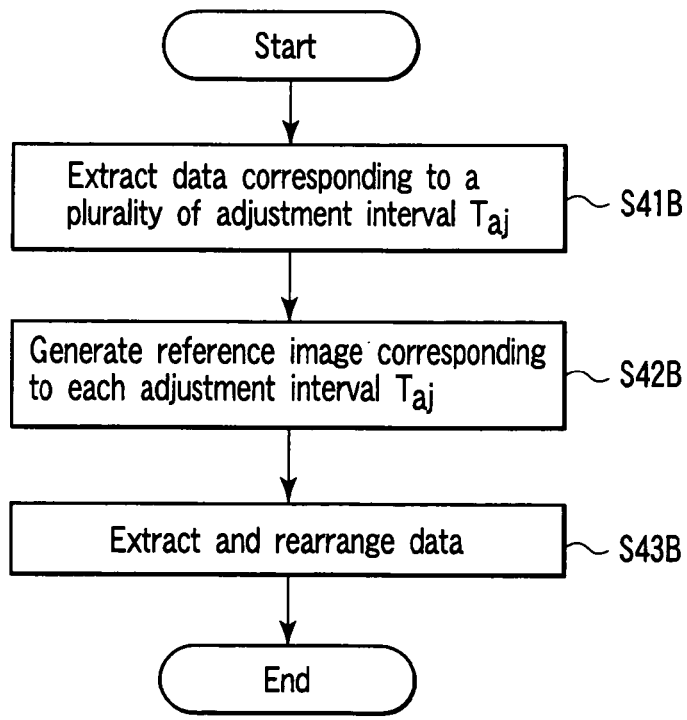
F I G. 9

MAGNETIC RESONANCE IMAGING APPARATUS AND MAGNETIC RESONANCE IMAGING APPARATUS CONTROL METHOD

BACKGROUND OF THE INVENTION

1. Field of the Invention

The present invention relates to an imaging technique for a magnetic resonance imaging apparatus and, more particularly, to a technique used for imaging a coronary artery.

2. Description of the Related Art

A magnetic resonance imaging apparatus is an apparatus which images the chemical and physical microscopic information of a substance or is used for the observation of a chemical shift spectrum by using a phenomenon in which when a group of nuclei having a unique magnetic moment is placed in a homogenous static field, they resonantly absorb energy of an RF field that rotates at a specific frequency.

Recently, in image diagnosis using this magnetic resonance imaging apparatus, magnetic resonance coronary angiography (MRCA) using an imaging method (TrueSSFP/FISP/Balanced FFE method or the like) which uses a steady state has been frequently used. This method can visualize a coronary artery without using any contrast medium. In addition, performing imaging at a period in end-diastole at which a coronary artery stops substantially makes it possible to reduce the disturbance of image quality ground for the movement of the coronary artery. This technique can make a coronary artery to be visualized with a contrast medium and is therefore expected as a method for screening of a coronary artery or the like.

FIG. 7 is a view for explaining a scan series in conventional magnetic resonance coronary angiography (MRCA). As disclosed in, for example, Jpn. Pat. Appln. KOKAI Publication NO. 11-229571, conventional MRCA uses a method of performing imaging by detecting an R wave in an ECG waveform and starting a scan a predetermined delay time after the detection by using the R wave as a trigger, as shown in FIG. 7.

In conventional MRCA, however, even if an optimal delay time (that allows imaging immediately before the detection of the next R wave) is set at the start of imaging, since the heart rate (R-R) of a patient changes, the set condition deviates from the optical condition in actual data acquisition, resulting in a deterioration in coronary artery visualization performance.

BRIEF SUMMARY OF THE INVENTION

The present invention has been made in consideration of the above situation, and has as its object to provide a magnetic resonance imaging apparatus which can suitably visualize a coronary artery even if the heart rate (R-R) of a patient changes, and a control method for the apparatus.

According to the present invention, in order to achieve the above object, the following prescriptions are provided.

According to an aspect of the present invention, there is provided a magnetic resonance imaging apparatus comprising a pulse sequence generating unit which repeatedly generates a data acquisition pulse sequence based on the same phase encoding pattern at least twice, a magnetic field generating unit which generates a gradient field on the basis of the data acquisition pulse sequence and applies the gradient field to a subject to be examined, a magnetic field generating unit which generates an RF field on the basis of the data acquisition pulse sequence and applies the RF field to the subject, a data acquiring unit which acquires magnetic resonance data on the basis of a magnetic resonance signal generated in the subject, a heartbeat information acquiring unit which acquires heartbeat information of the subject, an extracting unit which extracts partial magnetic resonance data from the magnetic resonance data on the basis of the acquired heartbeat information, and a reconstructing unit which reconstructs an image by using the extracted partial magnetic resonance data.

According to another aspect of the present invention, there is provided a magnetic resonance imaging apparatus control method, comprising repeatedly generating a data acquisition pulse sequence based on the same phase encoding pattern at least twice, generating a gradient field on the basis of the data acquisition pulse sequence and applying the gradient field to a subject to be examined, generating an RF field on the basis of the data acquisition pulse sequence and applying the RF field to the subject, acquiring magnetic resonance data on the basis of a magnetic resonance signal generated in the subject, acquiring heartbeat information of the subject, extracting partial magnetic resonance data from the magnetic resonance data on the basis of the acquired heartbeat information, and reconstructing an image by using the extracted partial magnetic resonance data.

BRIEF DESCRIPTION OF THE SEVERAL VIEWS OF THE DRAWING

FIG. 8 is a flowchart showing an example of the flow of adjustment interval $T_{aj}$ determination process;

FIG. 9 is a flowchart showing another example of the flow of adjustment interval $T_{aj}$ determination process;

DETAILED DESCRIPTION OF THE INVENTION

Figure 1:
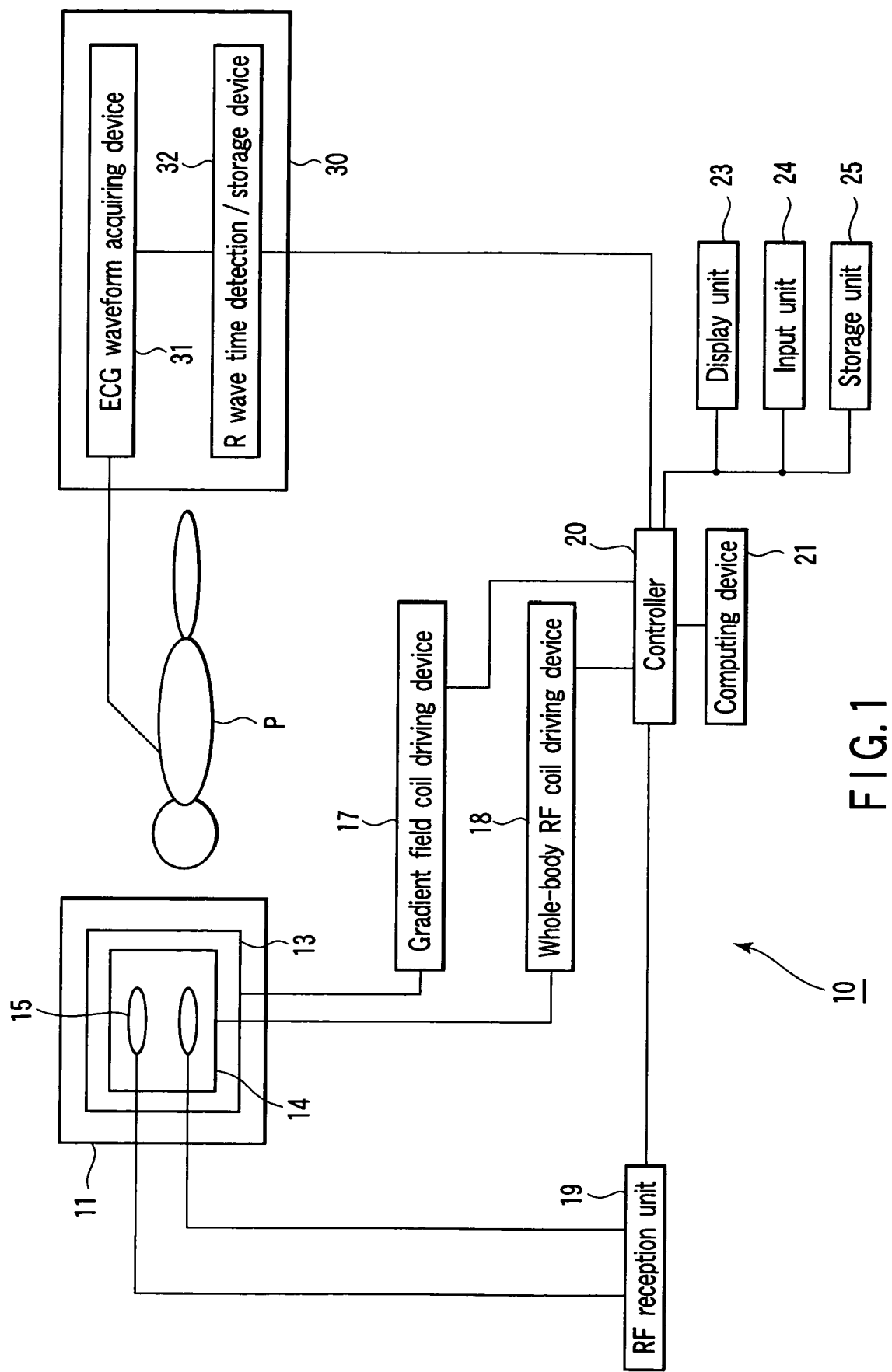
FIG. 1 is a block diagram showing the arrangement of a magnetic resonance imaging apparatus 10 according to this embodiment.

The first and second embodiments of the present invention will be described below with reference to the views of the accompanying drawing. In the following description, the same reference numerals denote constituent elements having substantially the same functions and arrangements, and a repetitive description will be made only when required.

First Embodiment

FIG. 1 is a block diagram showing the arrangement of a magnetic resonance imaging apparatus 10 according to this embodiment. The arrangement of the magnetic resonance imaging apparatus 10 will be described first with reference to FIG. 1.

The magnetic resonance imaging apparatus 10 comprises a static field magnet 11, a gradient field coil 13, a whole-body radio frequency (RF) coil 14, a radio frequency reception coil 15, a gradient field coil driving device 17, a whole-body RF coil driving device 18, an RF reception unit 19, a controller 20, a computing device 21, a display unit 23, an input unit 24, a storage unit 25, an ECG waveform acquiring device 31 housed in an ECG device 30, and an R wave time detection/storage device 32.

The static field magnet 11 is a magnet which generates a static field. The static field magnet 11 generates a homogenous static field. For example, as the static field magnet 11, a permanent magnet, superconductive magnet, or the like is used, which is cooled by a cooling system (not shown).

The gradient field coil 13 is a field coil having a shorter axial length than the static field magnet 11, and is provided inside the static field magnet 11. The gradient field coil 13 forms a gradient field having linear gradient field distributions in three orthogonal directions, i.e., X, Y, and Z directions, on the basis of the pulse current supplied from the gradient field coil driving device 17. A signal generating region (position) is specified by the gradient field generated by the gradient coil 13.

Assume that the Z-axis direction coincides with the static field direction (the body axis direction of a subject to be examined) in this embodiment. Assume that in this embodiment, the gradient field coil 13 and static field magnet 11 have cylindrical shapes. In addition, the gradient field coil 13 may be placed in a vacuum by a predetermined support mechanism. From the viewpoint of noise reduction, this arrangement is employed to prevent the vibrations of the gradient field coil 13, which are generated by the application of pulse currents, from being propagated to the outside as sound waves.

The whole-body RF coil 14 is a coil which applies a radio frequency pulse for generating a magnetic resonance signal to an imaging region of the subject. This coil is also used as a reception coil when, for example, an abdominal region is to be imaged.

The radio frequency reception coil (RF reception coil) 15 is a movable surface coil having a shape specialized for each region.

The whole-body RF coil driving device 18 includes an oscillating unit, phase selecting unit, frequency converting unit, amplitude modulating unit, and radio frequency power amplifying unit (none of which are shown), and transmits a radio frequency pulse corresponding to a Larmor frequency to the whole-body RF coil 14. The magnetization of a predetermined nucleus of the subject is excited by the radio frequency wave generated from the whole-body RF coil 14 upon this transmission.

The RF reception unit 19 has an amplifying unit, intermediate frequency converting unit, phase detecting unit, filter, and A/D converter (none of which are shown), and individually performs predetermined signal processing for each magnetic resonance signal (radio frequency signal) received from each receiver. The RF reception unit 19 performs amplification processing, intermediate frequency conversion processing using an oscillation frequency, phase detection processing, filter processing, and A/D conversion processing for the magnetic resonance signal which is emitted when the magnetization of the nucleus relaxes from the excited state to the ground state.

The controller 20 has a CPU, memory, and the like (not shown), and serves as a control center of the overall system to statically or dynamically control this magnetic resonance imaging apparatus. In performing parallel imaging, in particular, the controller 20 performs control to concurrently receive and process magnetic resonance signals by using a plurality of RF reception coils having different sensitivity distributions.

The controller 20 controls the gradient field coil driving device 17 and whole-body RF coil driving device 18 to generate a pulse sequence for retrospective imaging (to be described later) in accordance with a predetermined control program.

The computing device 21 obtains the spectrum data or image data of a desired nuclear spin inside the subject by acquiring digital signals sampled by the RF reception unit 19 and executing post-processing, i.e., reconstruction such as a Fourier transform. The computing device 21 also executes processing associated with a retrospective function (to be described later) under the control of the controller 20. In addition, the computing device 21 executes image formation by parallel imaging. In this case, parallel imaging is a technique of shortening the imaging time by performing expansion processing of executing a sequence, from which phase encoding is omitted, using a plurality of RF reception coils with different sensitivity distributions, and removing aliasing artifacts by matrix computation. When parallel imaging is performed, images are respectively reconstructed from the magnetic resonance signals from the respective coils, and expansion processing is performed as post-processing for the obtained images by using the sensitivity distributions of the respective coils, thereby generating one image.

The display unit 23 is an output device which displays, for example, the spectrum data or image data input from the computing device 21 through the controller 20. The display unit 23 can also simultaneously display a local image associated with a diagnosis region which is acquired by a micro-coil 15a and a wide-area image acquired by a wide-area coil 15b upon combining (superimposing) the images at corresponding positions or arranging them side by side.

The console 24 has an input device (e.g., a mouse, trackball, mode switch, and keyboard) for inputting various commands, instructions, and information from the operator.

The storage unit 25 stores magnetic resonance signal data before reconstruction which is obtained through the reception unit 19, magnetic resonance image data after reconstruction which is obtained through the computing device 21, and the like for each patient.

The ECG waveform acquiring device 31 acquires an ECG waveform representing a temporal change in the electrical phenomenon of the heart of a subject P to be examined.

The R wave time detection/storage device 32 detects and stores the R wave occurrence time of each ECG waveform acquired by the ECG waveform acquiring device 31.

Both the ECG waveform acquiring device 31 and the R wave time detection/storage device 32 are provided in the ECG device 30. However, the present invention is not limited to this. For example, the R wave time detection/storage device 32 may be provided on the main body side of the magnetic resonance imaging apparatus 10.

(Partial-Retrospective Imaging Function)

The retrospective imaging function of the magnetic resonance imaging apparatus 10 will be described next. This function can be divided into a function at the scanning stage and a function at the postprocessing (image reconstruction, in particular) stage. First of all, at the scanning stage, a scan is executed a plurality of times in accordance with the same encoding pattern by using a specific time phase in one heartbeat (an R wave occurrence time phase in an ECG waveform in this case) as a trigger.

At the postprocessing stage, image reconstruction is performed by using data necessary for image reconstruction (e.g., image data corresponding to one frame) extracted from the data obtained by the above scan by retrospecting from a specific time phase in one heartbeat which occurs after the execution of the scan.

Figure 2:
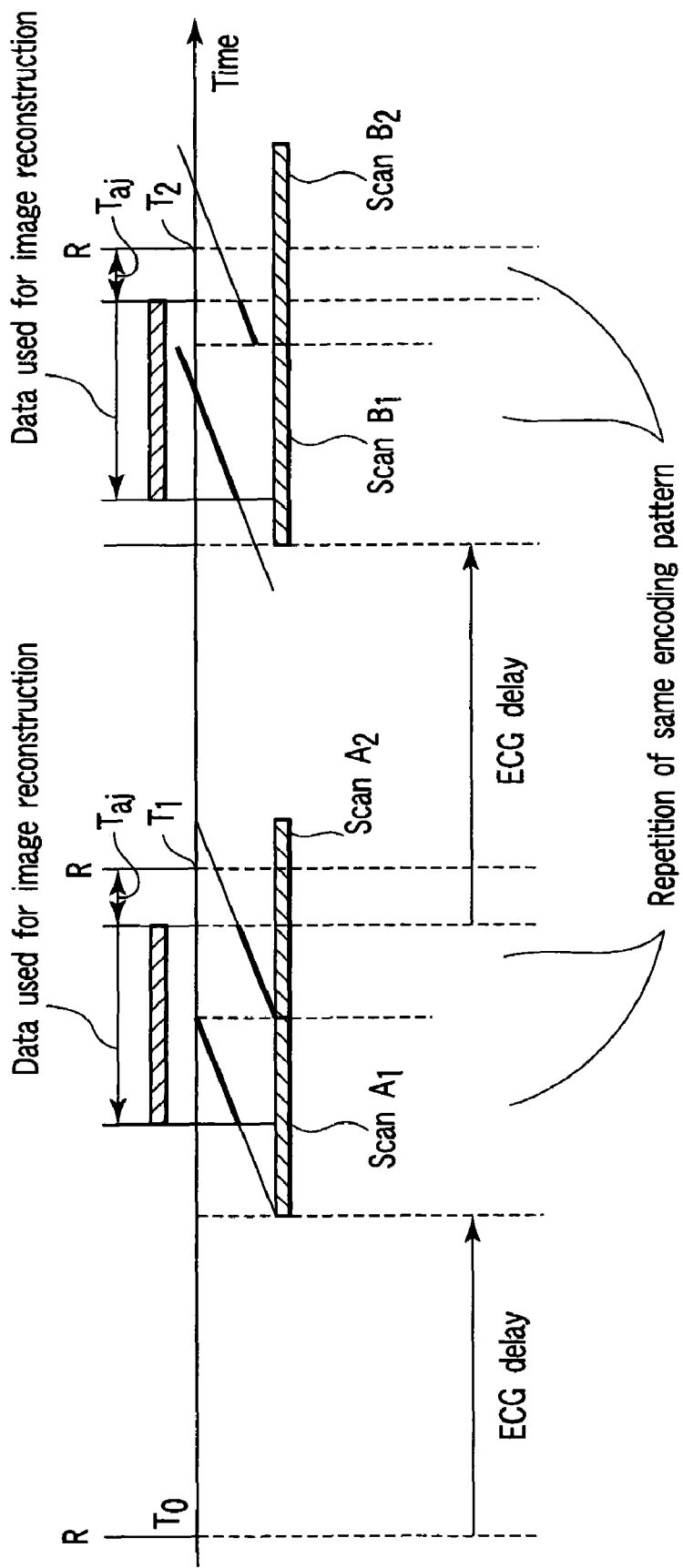
FIG. 2 is a view for explaining the partial-retrospective imaging function of the magnetic resonance imaging apparatus according to the first embodiment.

FIG. 2 is a view for explaining the retrospective imaging function of this magnetic resonance imaging apparatus, and is a view showing the relationship between the R wave occurrence times in an ECG waveform and the scanning timings. The oblique line connecting the start time and the end time in each scan interval in FIG. 2 symbolically indicates one scan based on a predetermined encoding pattern. The stepwise rise of these oblique lines (for example, the oblique lines corresponding to scans $B_1$ and $B_2$ are one step higher than those corresponding to scans $A_1$ and $A_2$) expresses that the encoding pattern is advanced by one step.

In this case, one scan means a series of operations from the application of a gradient field for the selection of a specific slice and the application of a gradient field which is executed in accordance with a specific phase and frequency encoding pattern to the reception of magnetic resonance signals read upon the application of these gradient fields.

As shown in FIG. 2, first of all, the scan $A_1$ is executed a predetermined ECG delay time after time $T_0$ by using an R wave occurring at time $T_0$ as a trigger. Data are acquired by repeating a scan based on the same encoding pattern as that for the scan $A_1$ following the scan $A_1$. Note that, for the sake of simplicity, the case shown in FIG. 2 exemplifies the case wherein a scan (scan $A_2$) based on the same encoding pattern as that for the scan $A_1$ is repeated once.

The scan $B_1$ and the scan $B_2$ based on the same encoding pattern as that for the scan $B_1$ are executed after a lapse of a predetermined delay time by using an R wave next to the R wave occurring at time $T_0$ as a trigger (i.e., the R wave occurring at time $T_1$). These scans $B_1$ and $B_2$ are scans corresponding to the encoding pattern advanced from the scans $A_1$ and $A_2$ by a predetermined step.

These scan sequences are executed until all three-dimensional data necessary for coronary artery imaging are acquired by repeating the entire scanning operation a predetermined number of times. The MR data obtained in this manner are sequentially stored in the storage unit 25 in association with the corresponding R waves and data acquisition time information. It is not essential that the MR data be associated with data acquisition time information at this point of time. For example, data acquisition time information may be calculated after this scan on the basis of the TR, TE, and sampling time in the scan.

Subsequently, the number of data necessary for image reconstruction (the number of data corresponding to one image) are extracted from the acquired MR data by temporally retrospecting, through an adjustment interval $T_{aj}$, from the R wave occurrence time next to the R wave used as the trigger on the basis of the data acquisition time information and R wave times to generate a data set for imaging the movement of the heart which is associated with end-diastole after the occurrence of the R wave used as the trigger, thereby performing image reconstruction.

More specifically, with respect to the scan data (data corresponding to the scans $A_1$ and $A_2$) acquired by using the R wave occurring at time $T_0$ as a trigger, an encoding step at time $T_1$ of the next R wave is detected. Referring to FIG. 2, the next R wave (the R wave at time $T_1$) has occurred at some midpoint in the data corresponding to the scan $A_2$. Therefore, the acquired data is temporally retrospected from time $T_1$ through the adjustment interval $T_{aj}$ to extract data up to the first encoding pattern for the scan $A_2$.

With this operation alone, complete encoding pattern data cannot be obtained. For this reason, data equivalent to the insufficient encoding pattern is extracted from the data corresponding to the scan $A_1$, as shown in FIG. 2. If a scan based on the same encoding pattern is executed three times or more, data equivalent to the insufficient encoding pattern may be data corresponding to any scan. From the viewpoint of reducing artifacts caused by the body movement of the patient, however, it is preferable to use data as close to time $T_1$ as possible.

Subsequently, a data set corresponding to the complete encoding pattern is generated on the basis of the extracted data corresponding to the scan $A_1$ and the data corresponding to the scan $A_2$. That is, the extracted data corresponding to the scan $A_1$ and the data corresponding to the scan $A_2$ are rearranged to make the encoding patterns continuous, thus generating one data set (in the case shown in FIG. 2, a data set is generated by rearranging the data in the order of the scan $A_1$ and the scan $A_2$).

Such operation of extracting data by retrospection with reference to the occurrence time of an R wave next to an R wave used as a trigger and rearranging the extracted data is applied to data (the scans $B_1$ and $B_2$) corresponding to the next R wave and data corresponding to encoding patterns in all the subsequent steps, thereby generating all data sets for imaging the movement of the heart which is associated with end-diastole after the occurrence of a predetermined R wave.

Note that the adjustment interval Taj in FIG. 2 can be set to an arbitrary value (time). Assume that a necessary amount of data is to be extracted by retrospection from an R wave next to an R wave used as a trigger. In this case, when this operation is to be executed exactly from the occurrence time of the next R wave, Taj=0 (e.g., see FIG. 3) may be set by operating a predetermined switch or the like provided on the input unit 24.

Such active adjustment of the adjustment interval $T_{aj}$ is practically useful especially when pulsation or cardiac blood dynamics vary depending on patients. This makes it possible to realize data extraction more suitable for coronary artery visualization.

Figure 3:
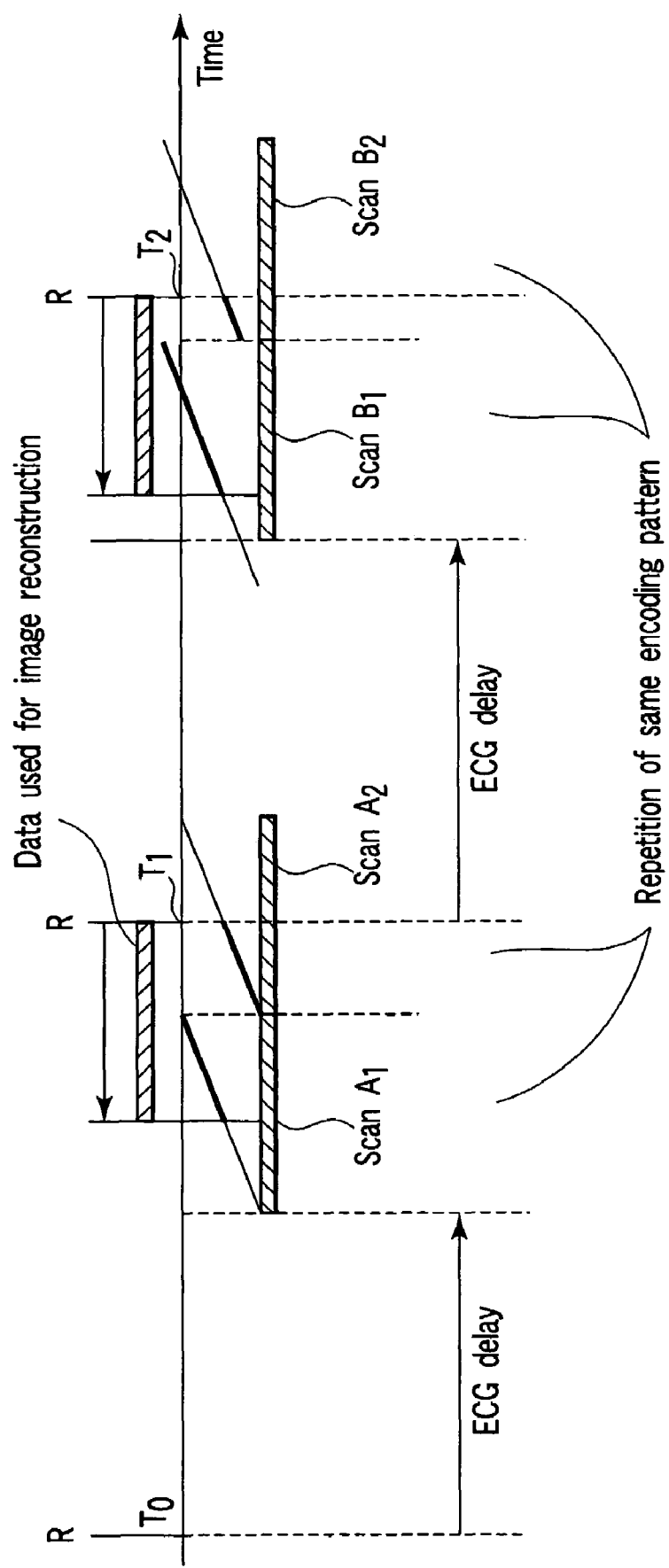
FIG. 3 is a view for explaining a modification of the partial-retrospective imaging function of the magnetic resonance imaging apparatus according to the first embodiment.

In this embodiment, the adjustment interval $T_{aj}$ is made uniform (set to a predetermined value) in the respective scans, as shown in FIGS. 2 and 3. However, the period of one heartbeat may change due to breath holding at the time of imaging operation. For this reason, the adjustment interval $T_{aj}$ may be actively adjusted for, for example, each scan.

(Imaging Operation)

Coronary artery imaging operation using the above retrospective imaging function will be described next.

Figure 4:
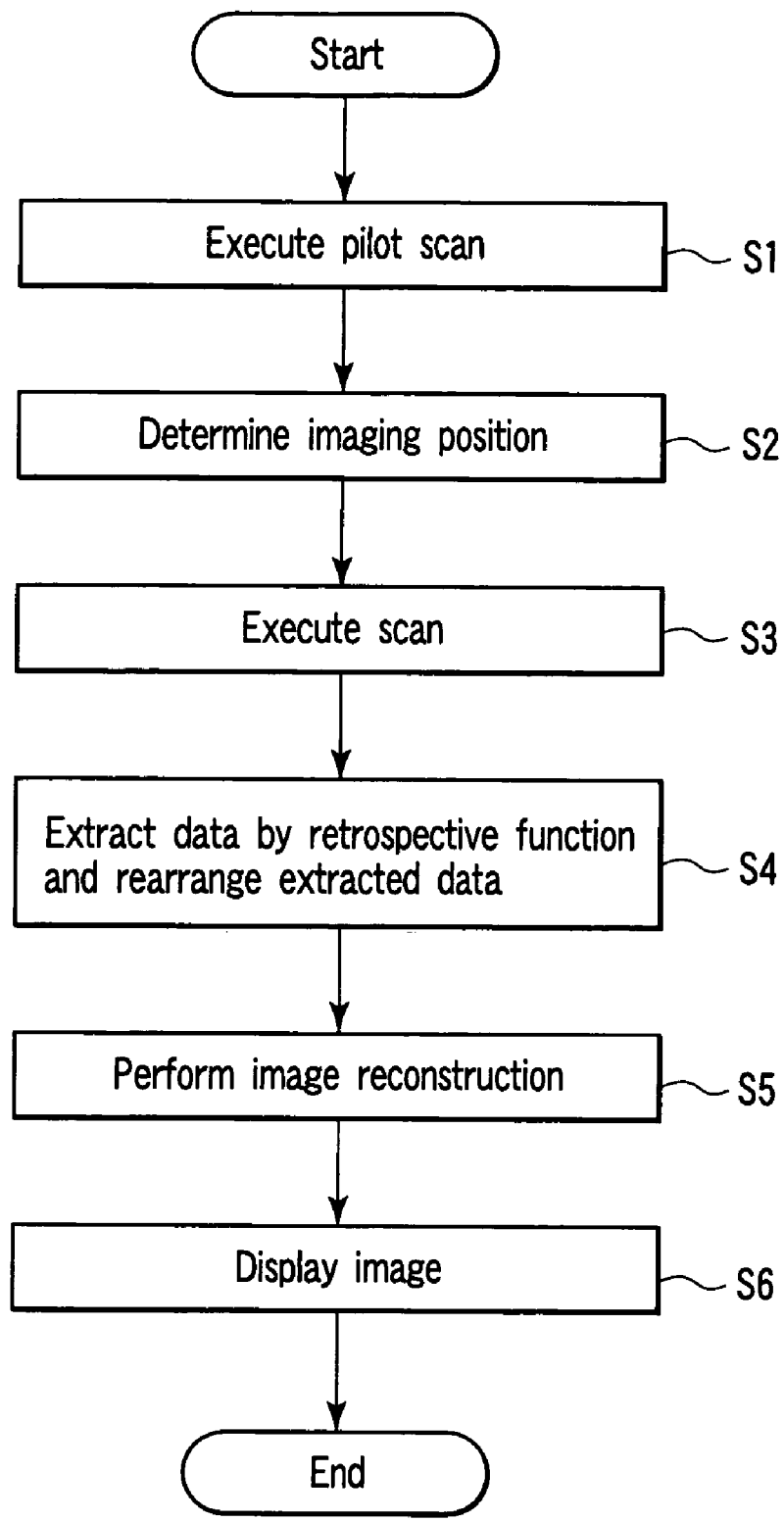
FIG. 4 is a flowchart showing the flow of each process executed by the magnetic resonance imaging apparatus 10 in coronary artery imaging.

FIG. 4 is a flowchart showing the flow of each process to be executed by the magnetic resonance imaging apparatus 10 in coronary artery imaging.

First of all, positioning imaging (pilot scan) is performed with respect to a predetermined region including the heart while magnetic resonance signals are received from the RF reception coil 15 (step S1). Each magnetic resonance signal obtained by the pilot scan is reconstructed by the computing device 21. Expansion processing is then performed for the resultant data to display one image as a positioning image on the display unit 23. In addition, this image is stored in the storage unit 25.

The operator then comprehends the position of a coronary artery as a diagnosis target while referring to the displayed positioning image, and determines the position of a slice (to be imaged) by setting the RF reception coil 15 to a proper position (step S2).

Subsequently, a scan on the slice is executed (step S3). The scan to be executed in accordance with the occurrence timing of each R wave at this time is executed at least two or more times in accordance with the same encoding pattern, as shown in FIG. 2 (or FIG. 3).

The necessary number of data for image reconstruction is extracted from acquired data by temporally retrospecting on the basis of the R wave time stored while temporally being associated with the executed pulse sequence. The extracted data is then rearranged to generate data equivalent to the complete encoding pattern corresponding to the R wave (step S4).

Image reconstruction is executed by using the obtained three-dimensional data set (step S5). The obtained MR image is displayed on the display unit 23 (step S6).

According to the above arrangement, the following effect can be obtained.

This magnetic resonance imaging apparatus uses data obtained by a scan which is temporally newest when retrospecting from the occurrence time of any R wave after an R wave used as a trigger, and also uses, for insufficient data of the obtained data, data obtained by the temporally newest scan which is based on the same encoding pattern as that for the executed scan, thereby generating complete three-dimensional data. Even if the R-R interval of the patient changes, data can always be acquired at end-diastole in a cardiac phase, and a good coronary artery image can be stably obtained.

Second Embodiment

The second embodiment of the present invention will be described next. This embodiment does not use any ECG delay unlike the first embodiment and is directed to perform imaging based on the above retrospective function by executing continuous scans.

Figure 5:
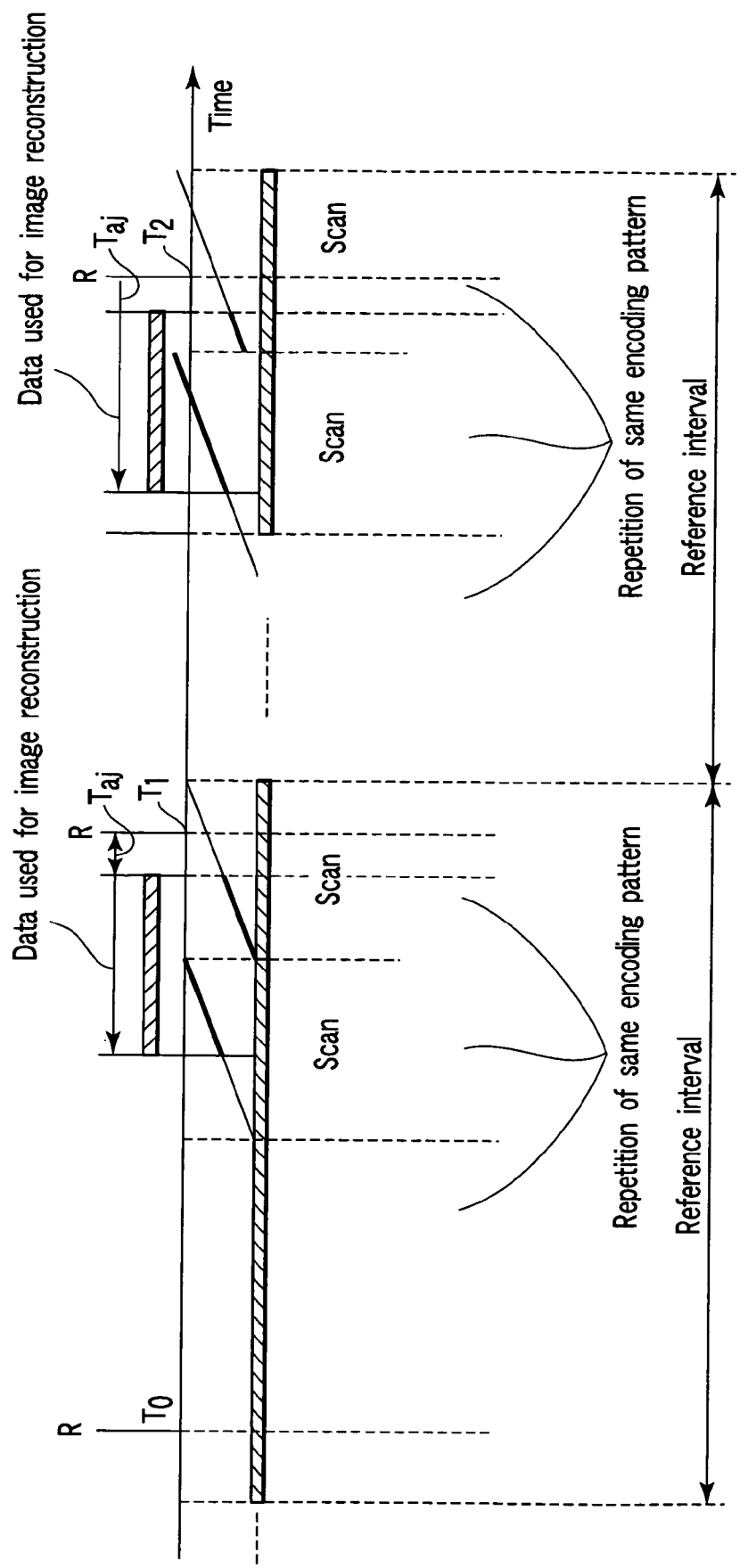
FIG. 5 is a view for explaining the full-retrospective imaging function of the magnetic resonance imaging apparatus according to the second embodiment.
Figure 6:
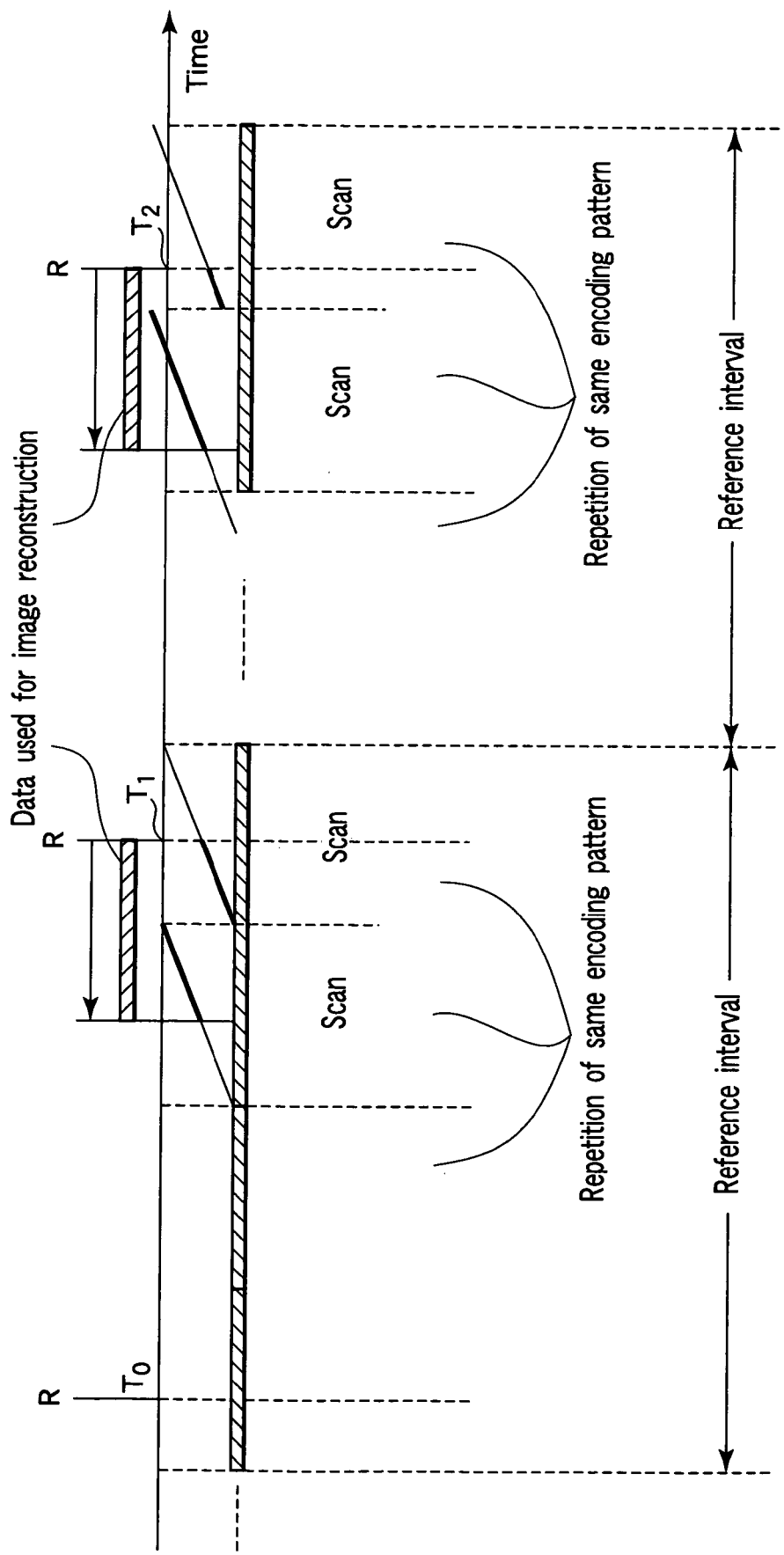
FIG. 6 is a view for explaining a modification of the full-retrospective imaging function of the magnetic resonance imaging apparatus according to the second embodiment.
Figure 7:
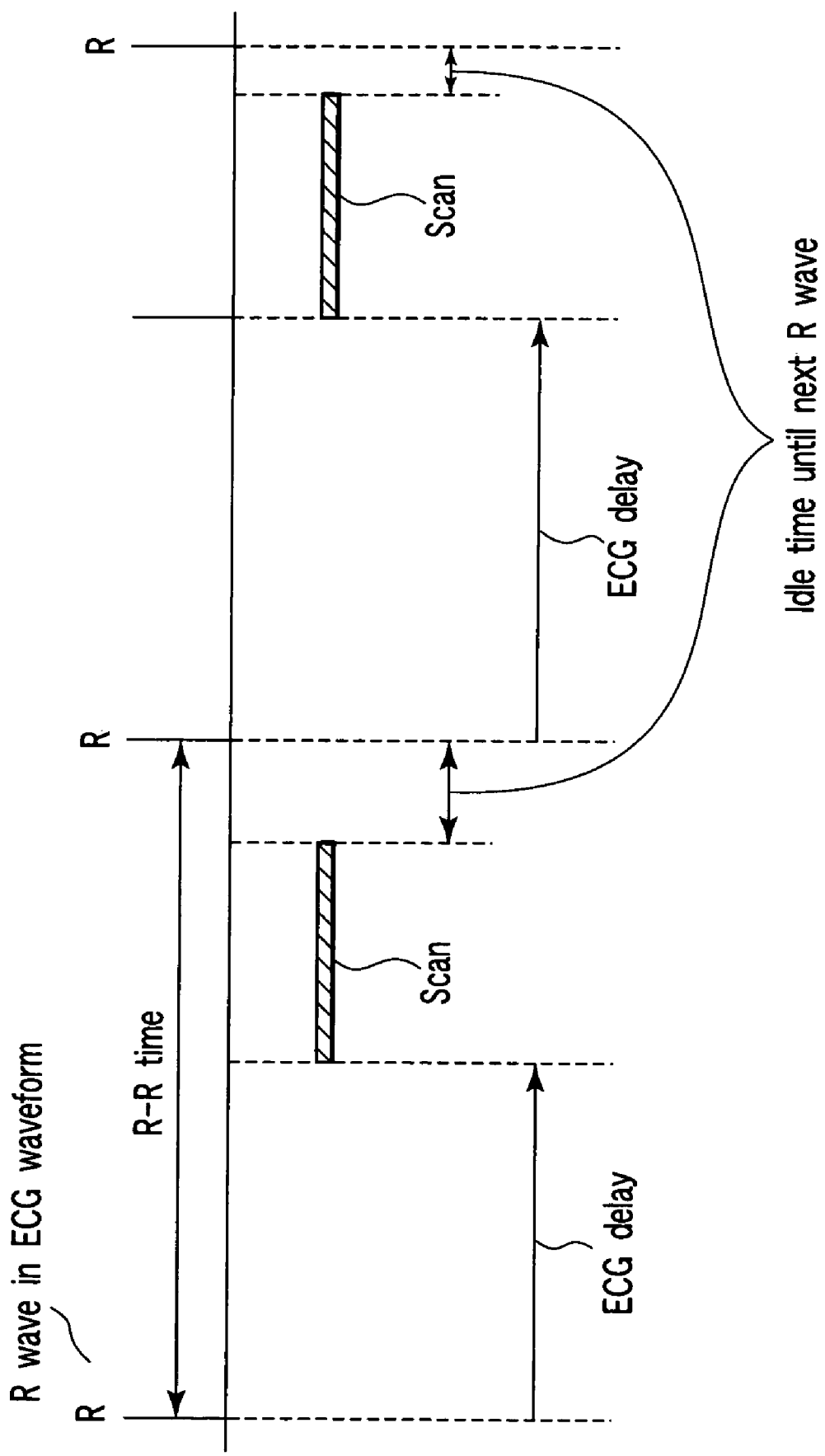
FIG. 7 is a view for explaining coronary artery imaging executed by a conventional magnetic resonance imaging apparatus.

FIG. 5 is a view for explaining a full-retrospective imaging function according to the second embodiment and a view showing the relationship between the R wave occurrence times and the scan timings.

First of all, the (almost) average R-R time of a patient is obtained, and an interval longer than the obtained time by a predetermined period of time is set as a reference interval. As shown in FIG. 5, in this reference interval, data acquisition is performed by repeatedly and continuously executing a scan in accordance with the same encoding pattern. The MR data corresponding to the respective phase encoding patterns which are acquired in this manner are sequentially stored in a storage unit 25 in association with the respective R waves and data acquisition time information.

After the data acquisition, the necessary number of data for image reconstruction are extracted from the acquired MR data by temporal retrospection from any R wave occurrence time, as a reference, after an R wave used as a trigger, on the basis of the data acquisition time information and the respective R wave occurrence times in accordance with the same sequence as that in the first embodiment. The extracted data are then rearranged to generate a data set for imaging the movement of the heart which is associated with end-diastole after the occurrence of a predetermined R wave, thereby performing image reconstruction.

Note that the second embodiment is the same as the first embodiment in that an adjustment interval $T_{aj}$ can be set to an arbitrary value (time). For example, setting $T_{aj}=0$ makes it possible to extract data necessary for reconstruction by performing retrospection exactly from the occurrence time of the next R wave.

(Imaging Operation)

Coronary artery imaging by the apparatus of this embodiment is executed by executing consecutive scans without using any ECG delay in step S3 in FIG. 3 and executing data extraction/rearrangement by using the above retrospective function in step S4.

According to the above arrangement, the same effect as that of the first embodiment can be obtained. In addition, since there is no interruption of RF pulses, the steady state of the spin system is maintained, and it is expected to further improve the coronary artery visualization performance.

Third Embodiment

The third embodiment of the present invention will be described next. In this embodiment, the adjustment interval $T_{aj}$ described in the first and second embodiments is actively controlled in accordance with a request from the user.

A technique of determining the adjustment interval $T_{aj}$ determines the range of data to be extracted for reconstruction. For this reason, the value of the adjustment interval $T_{aj}$ must be so determined as to include a cardiac time phase necessary for image diagnosis. In general, the time phases in which the cardiac motion stops during one heartbeat of a person include systole and end-diastole. If, therefore, the operator is interested in end-diastole in image diagnosis, the value of the adjustment interval $T_{aj}$ and an ECG delay time after an R wave occurring need to be determined such that extracted data includes data concerning the end-diastole time phase.

In this embodiment, in order to determine the value of the adjustment interval $T_{aj}$ so as to include a cardiac time phase necessary for image diagnosis, for example, the following three techniques are used. The first technique is to acquire biometric information of the subject and use it as a reference. The second technique is to use a sensed three-dimensional image as a reference. The third technique is to use, as a reference, a cine image generally acquired before imaging of a three-dimensional image. Each technique will be described in accordance with examples. In the following description, for the sake of a concrete explanation, telesystole is regarded as a cardiac time phase required for image diagnosis.

EXAMPLE 1

From a medical standpoint, it is said that end-diastole time phase exists in 75% to 95% of an R-R interval. A technique according to this example pays attention to this point. In this technique, biometric information (ECG waveform) of a subject to be examined is acquired, and adjustment interval $T_{aj}$ (=average value of R-R intervals)*25% is determined with reference to the acquired biometric information so as to include a telesystole time phase. In this technique, since the average value of R-R intervals is used, variations in R-R interval can be indirectly considered in determining the adjustment interval $T_{aj}$. Even if, therefore, the R-R interval varies due to, for example, arrhythmia or the mental state of a patient, the value of the adjustment interval $T_{aj}$ can be determined to include a telesystole time phase.

FIG. 8 is a flowchart showing an example of the flow of adjustment interval $T_{aj}$ determination processing. Note that each process shown in FIG. 8 is executed in step S4 in FIG. 4.

Referring to FIG. 8, first of all, a computing device 21 acquires a plurality of R-R intervals from an ECG device 30, and calculates the average value of them (step S41A). The computing device 21 then determines the adjustment interval $T_{aj}$ by multiplying the calculated average value of the R-R intervals by a predetermined coefficient (e.g., 0.25) for specifying a telesystole time phase (step S42A). The computing device 21 extracts data necessary for reconstruction by retrospecting by the determined adjustment interval $T_{aj}$ from an R wave at the final stage of each R-R interval, and rearranges the extracted data to generate data corresponding to a complete encoding pattern (step S43A).

EXAMPLE 2

In this magnetic resonance imaging apparatus, a scan based on the same encoding pattern is continuously performed a plurality of number of times. It is assumed that data in an end-diastole time phase is acquired without fail by these consecutive scans. A technique according to this example pays attention to this point. According to this technique, a plurality of reconstruction data are extracted with different adjustment intervals $T_{aj}$, and two-dimensional or three-dimensional images are generated and displayed on the basis of the extracted data. The apparatus or user selects one of the images which includes an end-diastole time phase with reference to the plurality of two-dimensional or three-dimensional images displayed in this manner, thereby determining the adjustment interval $T_{aj}$. Note that two-dimensional or three-dimensional images generated and displayed for the determination of the adjustment interval $T_{aj}$ in this manner will be referred to as "reference images" hereinafter.

FIG. 9 is a flowchart showing another example of adjustment interval $T_{aj}$ determination processing. Each process shown in FIG. 9 is executed in step S4 in FIG. 4.

Figure 10A:
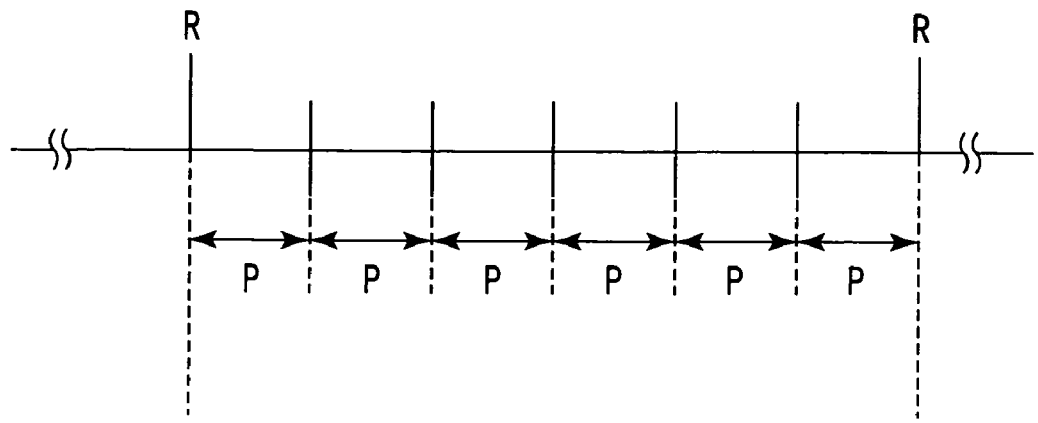
FIGS. 10A and 10B are views for explaining a method of determining a plurality of adjustment intervals $T_{aj}$ to be set in advance.
Figure 10B:
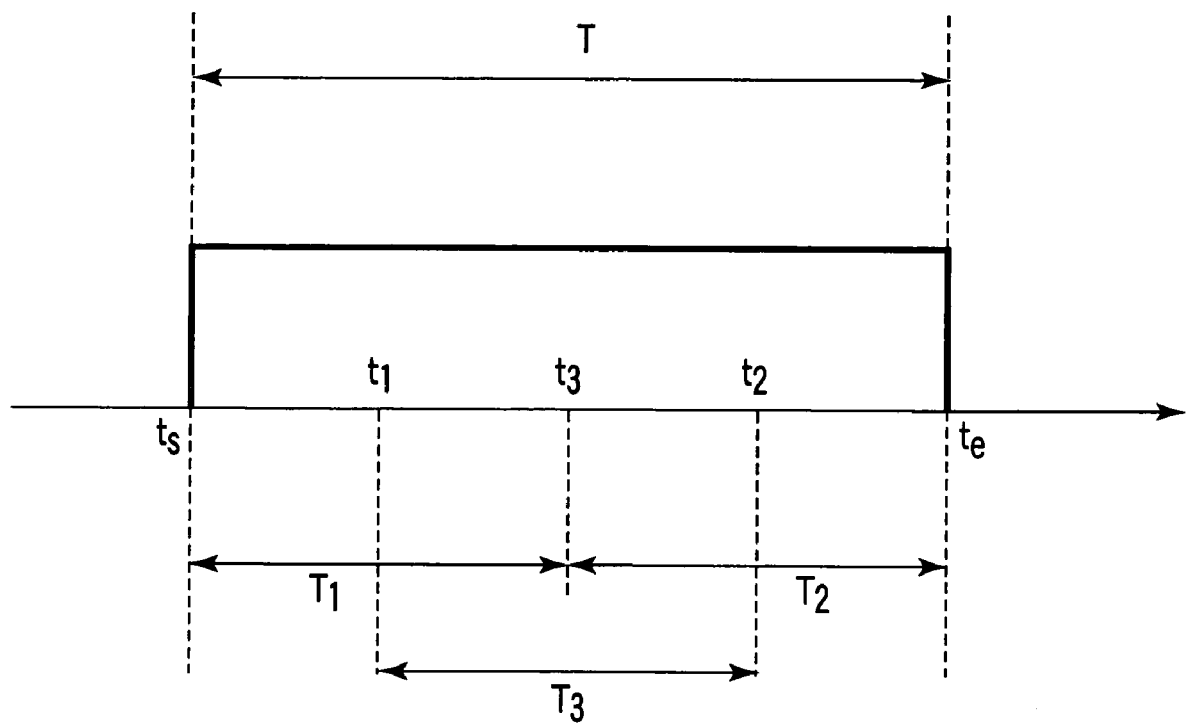

Referring to FIG. 9, first of all, the computing device 21 extracts a plurality of data necessary for reconstruction on the basis of a plurality of preset adjustment intervals $T_{aj}$ (step S41B). Note that the range of each data to be extracted in this step can be arbitrarily changed by predetermined operation. In addition, the present invention is not limited to the technique of determining a plurality of preset adjustment intervals $T_{aj}$. For example, adjustment intervals are so determined as to designate a plurality of intervals set by retrospecting from an R wave at the final stage of an R-R interval at predetermined intervals P as shown in FIG. 10A or, for example, intervals T1, T2, and T3 existing within an interval T (about 200 ms) in which the heart temporarily stops at telesystole as shown in FIG. 10B.

The computing device 21 then generates reference images corresponding to the respective extracted data. The generated reference images are automatically displayed on a display unit 23 (step S42B). Reference images may be separately displayed or displayed in the form of, for example, thumbnails. The operator observes the displayed reference images and selects a seemingly most suitable reference image (i.e., a reference image based on data extracted to include a telesystole time phase). The computing device 21 determines the adjustment interval $T_{aj}$ corresponding to the selected reference image as the adjustment interval $T_{aj}$ for extraction processing, extracts data necessary for reconstruction by using it, and executes rearrangement and the like (step S43B).

EXAMPLE 3

In general, in image diagnosis using this magnetic resonance imaging apparatus, cine (two-dimensional) imaging is executed before three-dimensional imaging. In a technique according to this example, cine images are generated and displayed as reference images, and the apparatus or the user selects one of the images which includes a telesystole time phase, thereby determining an adjustment interval $T_{aj}$.

Figure 11:
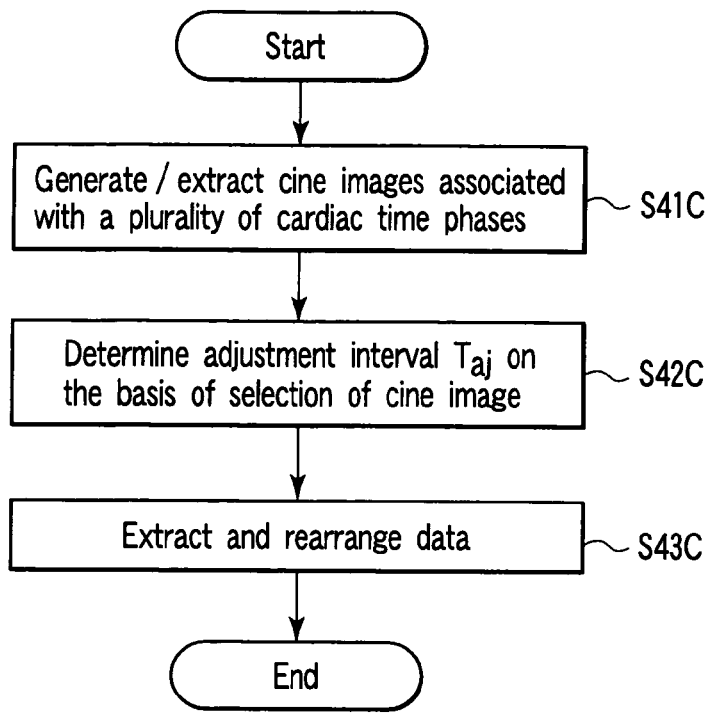
FIG. 11 is a flowchart showing still another example of adjustment interval $T_{aj}$ determination processing.

FIG. 11 is a flowchart showing another example of adjustment interval $T_{aj}$ determination processing. Each process shown in FIG. 11 is executed in step S4 in FIG. 4.

Referring to FIG. 11, first of all, cine images associated with a plurality of cardiac time phases are extracted from a plurality of cine images acquired before three-dimensional imaging using the retrospective function (step S41C). As described above, the extraction technique is not specifically limited. For example, adjustment intervals $T_{aj}$ are so determined as to designate a plurality of cardiac time phases set by retrospecting from an R wave at the final stage of an R-R interval at predetermined intervals P as shown in FIG. 10A or, for example, time phases t1, t2, and t3 existing within an interval T (about 200 ms) in which the heart temporarily stops at end-diastole as shown in FIG. 10B. The extracted cine images are displayed as reference images in a predetermined form.

The operator observes the displayed reference images and selects a seemingly most suitable reference image (i.e., a reference image based on data extracted to include an end-diastole time phase). The computing device 21 determines the adjustment interval $T_{aj}$ so as to include a cardiac time phase corresponding to the selected reference image (step S42C), extracts data necessary for reconstruction by using it, and executes rearrangement and the like (step S43C).

According to the above arrangement, the adjustment interval $T_{aj}$ can be determined such that extracted data include data concerning a cardiac time phase which is required for image diagnosis. Therefore, an MRI image which can achieve the purpose of image diagnosis can be provided. In this embodiment, in particular, the adjustment interval $T_{aj}$ is determined by using one of the following techniques: the first technique of acquiring biometric information of a subject to be examined and using the information as a reference; the second technique of using a sensed three-dimensional image as a reference; and the third technique of using a generally acquired cine image before three-dimensional imaging as a reference. This makes it possible to objectively determine the adjustment interval $T_{aj}$ and hence to eliminate variations in result depending on operators.

Fourth Embodiment

In general, the scan time required when a magnetic resonance imaging apparatus is used is about 100 ms, and an interval T in which the heart temporarily stops at telesystole is about 200 ms. Therefore, the stop interval T is longer than the scan time. There is a degree of freedom in executing a scan in any one of intervals T1 to T3 in FIG. 10B in the stop interval T.

In this embodiment, therefore, the interval T in which the heart temporarily stops at end-diastole is specified by using the first or third technique described in the third embodiment, and one of the intervals T1 to T3 is selected, by using the second technique described in the third embodiment, as an interval in which a scan should be executed, thereby determining the adjustment interval $T_{aj}$. This makes it possible to combine the determination of the adjustment interval $T_{aj}$ with reference to the biometric information (ECG waveform) of the subject and the determination of the adjustment interval $T_{aj}$ by the observation of reference images. As compared with the third embodiment, therefore, an adjustment interval $T_{aj}$ determination method with higher reliability can be realized.

Figure 12:
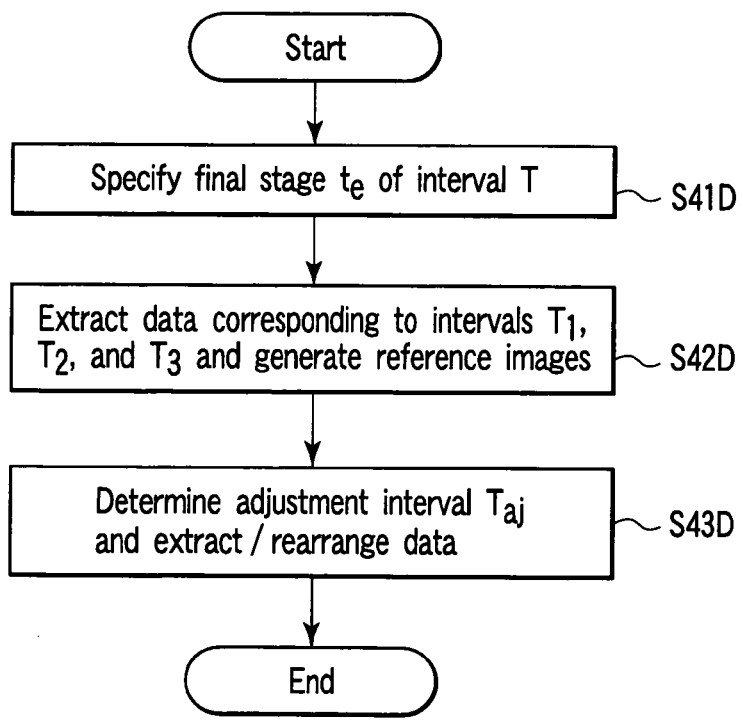
FIG. 12 is a flowchart showing the flow of adjustment interval $T_{aj}$ determination processing according to the fourth embodiment.

FIG. 12 is a flowchart showing the flow of adjustment interval Taj determination processing according to this embodiment. Each process shown in FIG. 12 is executed in step S4 in FIG. 4. Referring to FIG. 12, first of all, a computing device 21 specifies an initial stage ts or final stage te of the interval T by using the first or third technique (step S41D). That is, the computing device 21 specifies the final stage te by multiplying the average value of a plurality of R-R intervals by a predetermined coefficient for specifying an end-diastole time phase. Alternatively, some cine images acquired before three-dimensional imaging using the retrospective function are generated and displayed as reference images. The operator selects one of the displayed reference images to specify a cardiac time phase corresponding to the reference image as the final stage te.

Subsequently, data respectively corresponding to the intervals T1 to T3 within the interval T which is retrospected from the specified final stage te are extracted, and reference images based on the respective data are generated (step S42D). Reference images may be separately displayed or displayed in the form of, for example, thumbnails. The operator observes the displayed reference images and selects a seemingly most suitable reference image. The computing device 21 determines the adjustment interval $T_{aj}$ corresponding to the selected reference image as the adjustment interval $T_{aj}$ for extraction processing, extracts data necessary for reconstruction by using it, and executes rearrangement and the like (step S43D).

According to the above arrangement, the adjustment interval $T_{aj}$ can be determined to allow the execution of a scan in a desired interval within the interval T in which the heart temporarily stops. Therefore, an MRI image which allows one to achieve the purpose of image diagnosis more reliably as well as achieving the effect obtained by the third embodiment can be provided.

The present invention is not limited to the above embodiments, and can be embodied by modifying constituent elements in the execution stage within the spirit and scope of the invention. In addition, various inventions can be formed by proper combinations of a plurality of constituent elements disclosed in the above embodiments. More specifically, the following modifications can be made.

(1) In the above embodiments, insufficient data is extracted from the immediately preceding data set. In contrast to this, when a scan based on the same phase encoding pattern is to be executed three or more times, data may be extracted from a data set based on the same encoding pattern other than the immediately preceding data set, or may be obtained by interpolation. If, for example, the R-R interval becomes extremely short and the necessary number of data cannot be obtained by retrospection from an R wave, data may be extracted from the nearest data based on the same encoding pattern or may be interpolated from adjacent data.

(2) In the above embodiments, extraction of data necessary for reconstruction is executed with reference to the R wave occurrence time immediately after an R wave used as a trigger. In this case, "scan trigger reconstruction reference time" is regarded as an "R-R" interval, and a reference time for data extraction in reconstruction is set in the same time phase in a heartbeat immediately after a trigger.

However, a "scan trigger reconstruction reference time" need not always be an "R-R" interval. For example, a "scan trigger reconstruction reference time" may be set to "2R-R" (a data extraction reference time in reconstruction is set in the same time phase in alternate heartbeats from a trigger), "3R-R" (a data extraction reference time in reconstruction is set in the same time phase in every second heartbeat from a trigger), or a longer interval.

(3) In each embodiment described above, an ECG waveform is used as information concerning a heartbeat, and an R wave occurrence time is used as a trigger reference time and a reference time for post-processing. However, information used as information concerning a heartbeat is not limited to an ECG waveform, and any information can be used as long as it allows to comprehending the movement (i.e., the heartbeat) of the heart at each time. Other specific examples include a pulse waveform, blood flow information, images obtained by other modalities (e.g., an ultrasound diagnosis apparatus), and an MR signal obtained by the magnetic resonance imaging apparatus.

When an MR signal obtained by the magnetic resonance imaging apparatus is to be used, in particular, data acquisition with zero encoding may be continuously performed by continuous application of a pulse sequence including an RF field and gradient field, and a scan for imaging may be executed in response to a change, as a trigger, in the data or data obtained by performing a one-dimensional Fourier transform of the data. That is, the magnetic resonance imaging apparatus continuously obtains MR signals originating from the movement of the heart and executes the above retrospective function on the basis of the MR signals.

(4) In the second embodiment described above, a scan is started by using a specific cardiac time phase (e.g., an R wave occurrence time phase in an ECG waveform) in one heartbeat as a trigger. However, the start of a scan need not be a specific cardiac time phase in one heartbeat, and may be an arbitrary time.

(5) In the third and fourth embodiments, for the sake of a concrete explanation, end-diastole is regarded as a cardiac time phase required for image diagnosis. However, the present invention is not limited to this. For example, even when the adjustment interval $T_{aj}$ and an ECG delay time after an R wave occurring are determined such that extracted data includes telesystole or middiastole, the technique described in the third and fourth embodiments can be used. In addition, when a plurality of data concerning a plurality of cardiac time phases in one heartbeat are required, the technique described in the third and fourth embodiments may be applied to each cardiac time phase.

(6) The respective functions according to the respective embodiments can also be implemented by installing, in a computer such as a workstation, programs which execute the corresponding processes and expanding the programs in a memory. In this case, the programs which can cause the computer to execute the technique can be distributed by being stored in storage media such as magnetic disks (floppy disks, hard disks, and the like), optical disks (CD-ROMs, DVDs, and the like), and semiconductor memories.

In addition, several constituent elements may be omitted from all the constituent elements in each embodiment. Furthermore, constituent elements in different embodiments may be properly combined.

What is claimed is:

1. A magnetic resonance imaging apparatus for imaging a coronary artery, said apparatus comprising:

a pulse sequence generating unit which, in conjunction with magnetic gradient and RF field generating units, repeatedly executes and applies a data acquisition MRI pulse sequence at least twice using the same phase encoding increment on a subject to be imaged;

a data acquiring unit which acquires plural sets of MRI data respectively corresponding to said repeated MRI pulse sequences using the same phase encoding increment;

a heartbeat information acquiring unit which acquires heartbeat information of the subject concerning a first heartbeat and a second later occurring heartbeat;

said pulse sequence generating unit using the first heartbeat information to trigger the data acquisition MRI pulse sequence within a predetermined cardiac time phase;

an extracting unit which selects subsets of said plural sets of MRI data based on a predetermined cardiac time phase of the acquired second heartbeat information and from respectively corresponding time ranges by a predetermined interval measured after data acquisition backward in time from a reference cardiac time phase determined by the second heartbeat information; and a reconstructing unit which reconstructs an image of the patient's heart tissue during a predetermined cardiac time phase even if the heart rate of the patient changes by reconstructing an image from the selected subsets of MRI data.

2. An apparatus according to claim 1, wherein: the reconstructing unit reconstructs a three-dimensional image by using the selected subsets of MRI data.

3. An apparatus according to claim 1, wherein: the extracting unit selects subsets of MRI data from two sets of MRI data that have been acquired in successive adjacent time spans in the time domain.

4. An apparatus according to claim 1, wherein:
the pulse sequence generating unit continuously generates the data acquisition pulse sequences.

5. An apparatus according to claim 1, further comprising an adjusting unit which adjusts the predetermined interval on the basis of biometric information of the subject.

6. An apparatus according to claim 5, wherein:
the biometric information represents the time occurrence of a heartbeat.

7. An apparatus according to claim 5, wherein:
the reconstructing unit reconstructs cine images respectively corresponding to each of different cardiac time phases, and
the adjusting unit adjusts the predetermined interval so as to include a cardiac time phase corresponding to a user-selected one of said cine images.

8. An apparatus according to claim 5, wherein:
the extracting unit selects subsets of MRI data for each of different predetermined intervals,
the reconstructing unit reconstructs a plurality of reference images from said selected subsets of MRI data for each of different predefined intervals, and
the adjusting unit adjusts the predetermined interval so as to include MRI data corresponding to a user-selected one of said reference images.

9. An apparatus according to claim 5, which further comprises a calculating unit which calculates a heartbeat stop interval in one heartbeat cycle from heartbeat information of the subject, and in which:

the extracting unit selects subsets of acquired different MRI data sets when the predetermined interval does not overlap the heartbeat stop interval,
the reconstructing unit reconstructs a plurality of reference images from the selected subsets of different MRI data sets, and
the adjusting unit adjusts the predetermined interval so as to include acquired MRI data corresponding to a user-selected one of said reference images.

10. An apparatus according to claim 5, which further comprises a designating unit which designates a heartbeat stop interval in one heartbeat cycle of the subject based on a cine image of the subject acquired in advance or on an input from the user, and in which:
the extracting unit selects subsets of acquired different MRI data sets when the predetermined interval does not overlap the heartbeat stop interval,
the reconstructing unit reconstructs a plurality of reference images from the selected subsets of different MRI data sets, and
the adjusting unit adjusts the predetermined interval so as to include acquired MRI data corresponding to a user-selected one of said reference images.

11. An apparatus according to claim 1, wherein the extracting unit selects subsets of MRI data preferentially at data acquisition times closest to a predetermined cardiac time phase.

12. An apparatus according to claim 1, wherein:
the pulse sequence generating unit executes repetitive generation of a data acquisition pulse sequence based on the same phase encoding increment for a period of time longer than at least an average heartbeat time of the subject.

13. An apparatus according to claim 1, wherein:
the extracting unit selects subsets of MRI data and rearranges time sequences of said selected subsets of data to provide a complete composite set of MRI data from a reference time but having a continuous phase encoding increment.

14. A magnetic resonance imaging apparatus control method for imaging a coronary artery, said method, comprising:
repeatedly executing a data acquisition MRI pulse sequence using the same phase encoding increments on a subject to be imaged;
acquiring plural sets of MRI data respectively corresponding to said repeated MRI pulse sequences using the same phase encoding increments;
acquiring heartbeat information of the subject concerning a first heartbeat and a second later occurring heartbeat;
using said first heartbeat information to trigger the repeated execution of said MRI pulse sequence;
selecting subsets of said plural sets of MRI data based on a predetermined cardiac time phase of the acquired second heartbeat information and from respectively corresponding time ranges by a predetermined interval measured after data acquisition backward in time from a reference cardiac time phase determined by the second heartbeat information; and
reconstructing an image of the patient's heart tissue during a predetermined cardiac time phase even if the heart rate of the patient changes from the selected subsets of MRI data.

* * * * *